United States Patent [19]
You et al.

[11] Patent Number: 6,037,105
[45] Date of Patent: Mar. 14, 2000

[54] OPTICAL WAVEGUIDE DEVICE FABRICATING METHOD

[75] Inventors: Byong-Gwon You, Taejonkwangyok-shi; Hyung-Jae Lee, Seoul; Tae-Hyung Rhee, Songnam-shi; Yong-Woo Lee, Kyonggi-do, all of Rep. of Korea

[73] Assignee: SamSung Electronics Co., Ltd., Kyungki-do, Rep. of Korea

[21] Appl. No.: 09/038,960

[22] Filed: Mar. 12, 1998

[30] Foreign Application Priority Data

Mar. 12, 1997 [KR] Rep. of Korea .................. 97-8200

[51] Int. Cl.⁷ .................................................. G02B 6/12
[52] U.S. Cl. .................................. 430/321; 430/5
[58] Field of Search ........................ 430/320, 321, 430/5; 385/5, 8, 122, 132, 130, 129

[56] References Cited

U.S. PATENT DOCUMENTS

| | | | |
|---|---|---|---|
| 4,609,252 | 9/1986 | Wong et al. ............................ | 430/321 |
| 4,783,136 | 11/1988 | Elman et al. ......................... | 350/96.12 |
| 4,856,859 | 8/1989 | Imoto ................................. | 219/121.61 |
| 5,018,809 | 5/1991 | Shin et al. ........................... | 385/130 |
| 5,113,471 | 5/1992 | Inaishi et al. ........................ | 385/126 |
| 5,317,082 | 5/1994 | Beuhler et al. ....................... | 385/129 |
| 5,352,566 | 10/1994 | Springer et al. ...................... | 430/321 |
| 5,497,445 | 3/1996 | Imoto ................................. | 385/126 |
| 5,541,039 | 7/1996 | McFarland et al. .................... | 430/321 |
| 5,598,501 | 1/1997 | Maruo et al. ......................... | 385/143 |
| 5,613,995 | 3/1997 | Bhandarker et al. ................... | 385/132 |

FOREIGN PATENT DOCUMENTS

| | | | |
|---|---|---|---|
| 0258994 | 3/1988 | European Pat. Off. ............... | 385/130 |
| 0 446 672A1 | 9/1991 | European Pat. Off. . | |
| 0 689 094 A1 | 12/1995 | European Pat. Off. . | |
| 2131450 | 2/1973 | Germany .............................. | 385/132 |
| 1 537 634 | 1/1979 | Germany . | |
| 61-236506 | 10/1986 | Japan ................................. | 385/129 |
| 63-316805 | 12/1988 | Japan ................................. | 385/132 |
| 2205767 | 12/1988 | United Kingdom ................... | 385/122 |

*Primary Examiner*—Martin Angebranndt
*Attorney, Agent, or Firm*—Robert E. Bushnell, Esq.

[57] ABSTRACT

An optical waveguide device fabricating method which requires that a lower clad layer is formed on the surface of a glass substrate, a metal layer is formed on the lower clad layer, and a metal pattern is formed by selectively etching the metal layer, for forming a waveguide core therein. Then, an optical polymer layer is formed in the metal pattern, the optical polymer layer in a metal-free portion of the metal pattern is cured by irradiating UV light onto the lower surface of the substrate, and the waveguide core is formed by removing the other portion of optical polymer layer except for the cured portion thereof and the metal layer. Finally, an upper clad layer is formed on the lower clad layer and the waveguide core.

20 Claims, 6 Drawing Sheets

OPTICAL WAVEGUIDE DEVICE FABRICATING METHOD

CLAIM FOR PRIORITY

This application makes reference to, incorporates the same herein, and claims all benefits accruing under 35 U.S.C. §119 from an application for OPTICAL WAVEGUIDE DEVICE FABRICATING METHOD earlier filed in the Korean Industrial Property Office on Mar. 12, 1997, and there duly assigned Serial No. 8200/1997, a copy of which application is annexed hereto.

BACKGROUND OF THE INVENTION

1. Technical Field

The present invention relates to an optical waveguide device, and in particular, to a method for fabricating an optical waveguide device using an ultraviolet (UV) curable optical polymer to form a core with enhanced simplicity and free of contamination through back illumination of ultraviolet (UV) light.

2. Related Art

In optical communication systems, messages are transmitted by carrier waves of optical frequencies that are generated by sources such as lasers or light-emitting diodes. Optical communication systems are desirable over conventional communication systems because of a greatly increased number of communication channels and the ability to use other materials other than expensive copper cables for transmitting messages. A common device for conducting or guiding waves of optical frequencies from one point to another is an "optical waveguide." The carrier waves of optical frequencies are transmitted while at the same time confined within a particular region in the waveguide. Useful optical waveguide devices must have, for example, low optical transmission loss, low optical absorbance, facile fabrication, controllable refractive index ratios, and high heat resistance.

Contemporary optical waveguide devices and known fabrication techniques are disclosed, for example, in U.S. Pat. No. 4,609,252 for Organic Optical Waveguide Device And Method For Making issued to Wong et al., U.S. Pat. No. 4,783,136 for Optical Waveguides And Method For Making Same issued to Elman et al., U.S. Pat. No. 4,856,859 for Optical Waveguide And Method For Fabricating The Same issued to Imoto, U.S. Pat. No. 5,113,471 for Optical Waveguide Array And Method Of Manufacturing Same issued to Inaishi et al., U.S. Pat. No. 5,317,082 for Photodefinable Optical Waveguides issued to Beuhler et al., U.S. Pat. No. 5,497,445 for Polymer Core Optical Wave-Guide And Fabrication Method Thereof issued to Imoto, U.S. Pat. No. 5,541,039 for Method For Forming Optically Active Waveguides issued to McFarland et al., U.S. Pat. No. 5,598,501 for Polyimide Optical Waveguide And Method Of Manufacturing The Same issued to Marou et al., and U.S. Pat. No. 5,613,995 for Method For Making Planar Optical Waveguides issued to Bhandarkar et al. Generally, active optical waveguides have predominately been fabricated from inorganic crystalline materials. These materials in general have high dielectric constants and moderate electro-optic coefficients but require high temperature processing, and are therefore not easily fabricated and integrated with other semiconductor devices. Organic and especially polymeric organic materials are more suitable for fabrication and integration purposes because they can be processed at much lower temperatures and are amenable to solution and other chemical coating techniques. Reactive ion etching (RIE), photobleaching, or a poling induced technique is generally used to fabricate optical waveguide devices using polymeric materials. However, the substrate must be subjected to harsh conditions of lithography and liquid or reactive ion etched. These techniques, as I have observed, require additional vacuum equipments, increased fabrication time and complexity, all of which attribute to lower product yield. Moreover, contamination caused by direct contact between photomask and polymeric materials during fabrication cannot be avoided.

SUMMARY OF THE INVENTION

Accordingly, it is therefore an object of the present invention to provide a new and improved process of fabricating an optical waveguide device.

It is also an object to provide an optical waveguide device fabricating method which is remarkably simplified by using a UV-curable optical polymer.

It is further an object to provide an optical waveguide device fabricating method which can reduce fabrication time and complexity without use of additional vacuum equipments.

It is further an object to provide an optical waveguide device fabricating method which eliminates contamination caused by a direct contact between photomask and polymeric materials through back illumination of ultraviolet (UV) light.

It is yet another object to provide an optical waveguide device fabricating method which eliminates the need for photomask alignment during fabrication.

These and other objects of the present invention can be achieved by an optical waveguide device fabricating method for fabrication of an optical waveguide device, in which a lower clad layer is formed on the surface of a glass substrate, a metal layer is formed on the lower clad layer, and a metal pattern is formed by selectively etching the metal layer for forming a waveguide core therein. Then, an optical polymer layer is formed in the metal pattern, the optical polymer layer in a metalfree portion of the metal pattern is cured by irradiating ultra violet (UV) light onto the lower surface of the substrate, and the waveguide core is formed by removing the other portion of optical polymer layer except for the cured portion thereof and the metal layer. Finally, an upper clad layer is formed on the lower clad layer and the waveguide core.

The present invention is more specifically described in the following paragraphs by reference to the drawings attached only by way of example.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENT

Figure 1:
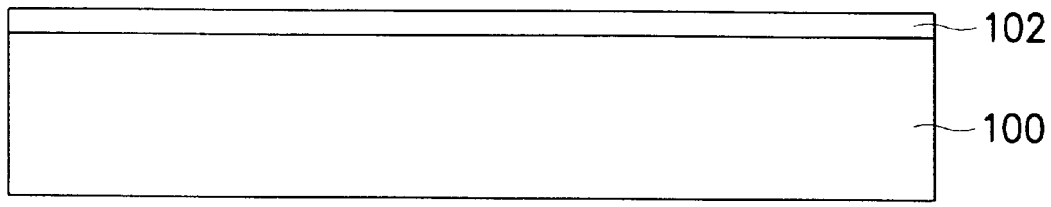
FIGS. 1–9 illustrate, in schematic cross-section, some major steps in the process of fabricating an optical waveguide device according to a preferred embodiment of the present invention.

Referring now to the drawings and particularly to FIGS. 1–9, which are sectional views sequentially illustrating an optical waveguide device fabricating method according to a preferred embodiment of the present invention.

As shown in FIG. 1, a lower clad layer 102 is formed by depositing a clad material on a substrate 100 which is made of a transparent glass of a low refractive index, such as Si, $SiO_2$, $LiNbO_3$, InP, GaAs, etc. The substrate 100, capable of transmitting UV light 108 for curing an optical polymer layer 110, is formed of a slide glass or a polymer glass fabricated out of polycarbonate or polymethyl methacrylate. The lower clad layer 102 has a lower refractive index than an optical polymer material for forming a waveguide core 114 and is transparent in an optical wavelength area used for conducting and guiding carrier waves of optical frequencies from one point to another.

Figure 2:
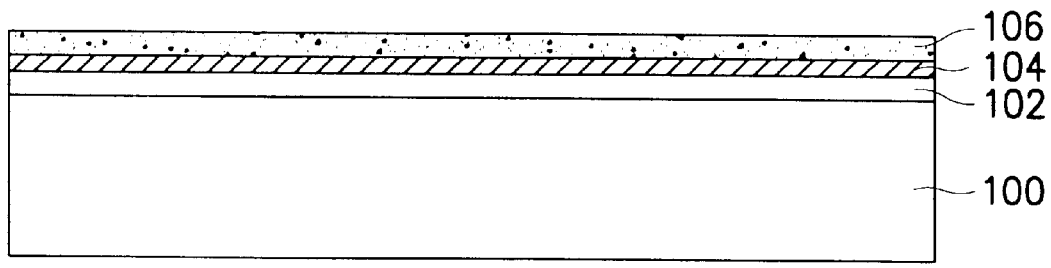

In FIG. 2, a metal layer 104 is deposited on the lower clad layer 102, and a photoresist 106 is deposited on the metal layer 104 by spin coating to bury the waveguide core 114. The metal layer 104 is used as a mask with respect to the UV light irradiation in order to eliminate the need of aligning a photomask on the substrate 100.

Figure 3:
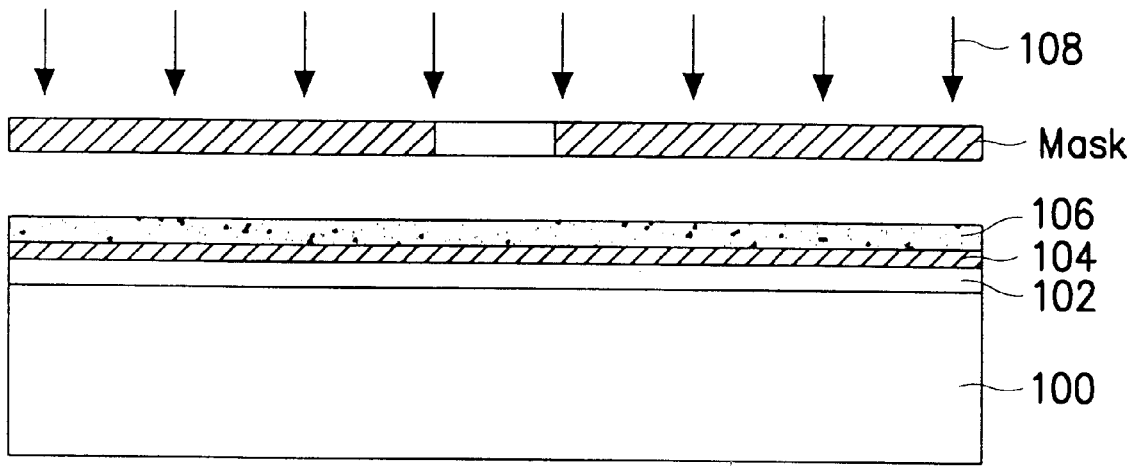
Figure 4:
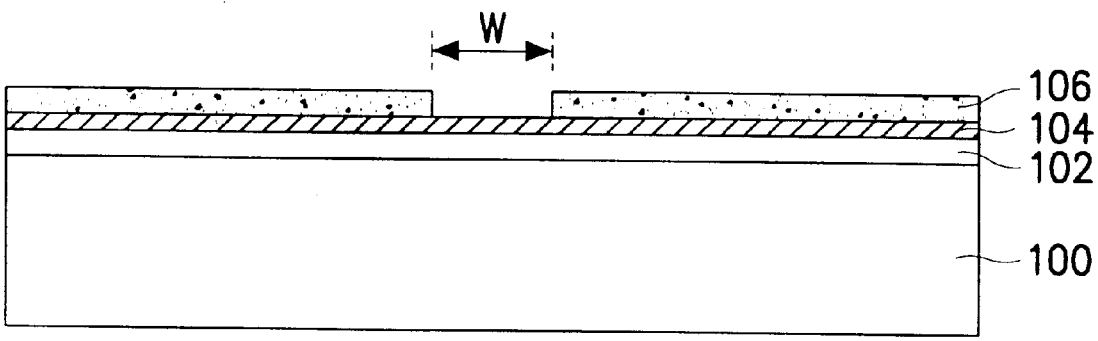
Figure 5:
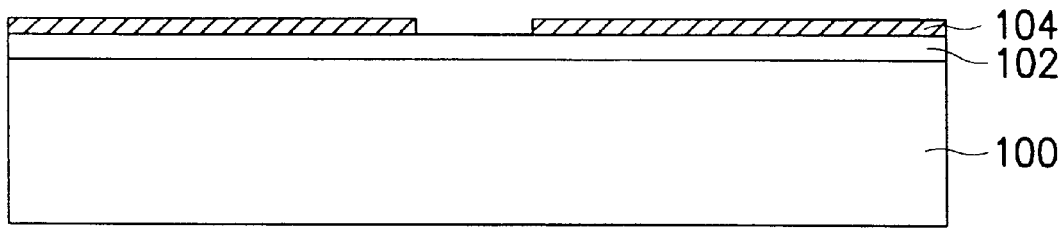

Then, a metal pattern W corresponding to the waveguide core 114 is formed as shown in FIG. 4 by irradiating the UV light 108 onto the metal layer 104 having the photoresist 106 formed thereon through a mask, as shown in FIG. 3. Subsequently, the photoresist 106 is developed by submerging the photoresist 106 in a development solution and then baked. Thus, the metal pattern W is formed in the metal layer 104 as shown in FIG. 5.

Figure 6:
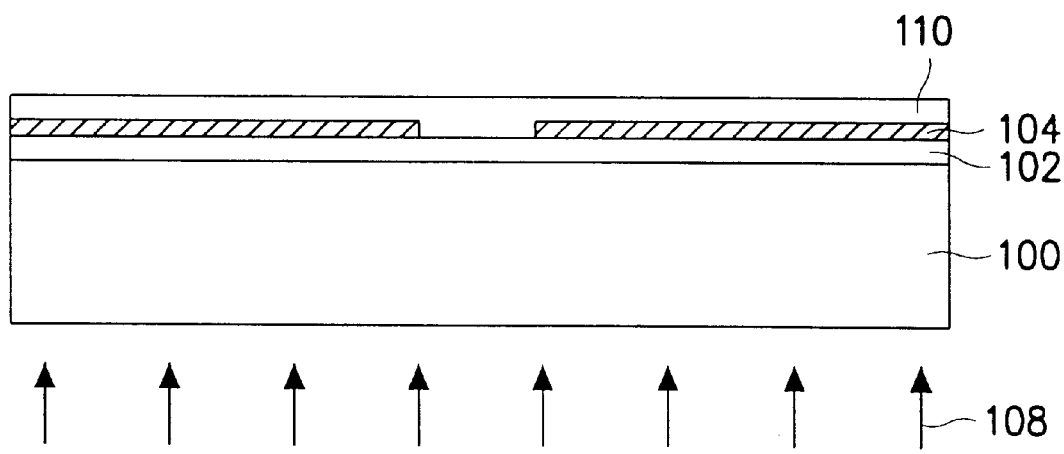

In FIG. 6, an optical polymer layer 10 is formed by depositing optical polymer curable by the UV light 108 on the metal layer 104 by spin coating in order to form the waveguide core 114. The polymer layer 110 is comprised of polymeric materials such as polydiacetylene, polymethacrylic acid, methyl polystyrene, polycarbonate, polyimide etc. In addition, the optical polymer for the optical polymer layer 110 may be linear or non-linear, but must have a higher refractive index than that for the lower clad layer 102 and an upper clad layer 116 and a low-loss optical transmissivity in an optical wavelength area used for conducting carrier waves of optical frequencies. Then, the UV light 108 is irradiated onto the lower surface of the substrate 100 having the optical polymer layer 110 formed thereon. As a result, with the metal layer 104 used as a mask, only a portion of the optical polymer layer 110 in the metal pattern W is cured, while the other portion thereof on the metal layer 104 remains non-cured.

Figure 7:
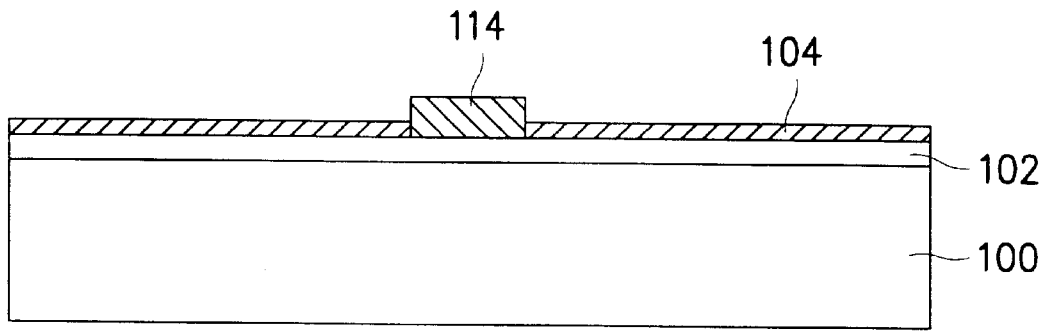
Figure 8:
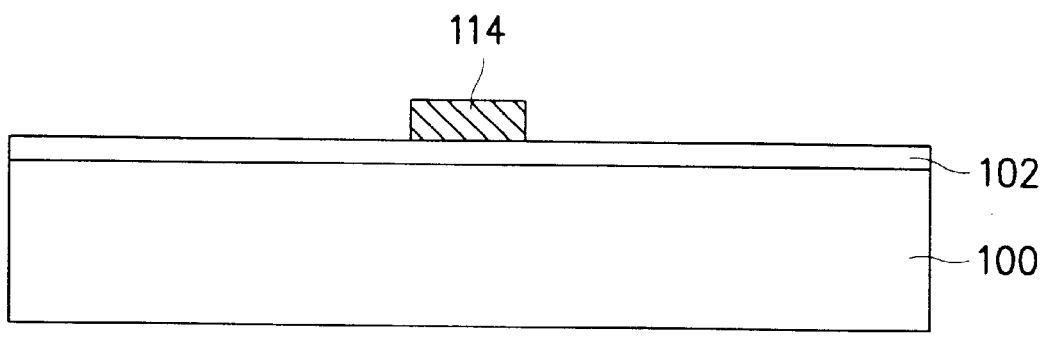

In FIG. 7, when the optical polymer layer 110 is cleaned off by an appropriate etching solution, the non-cured portion of the optical polymer layer 110 is etched, whereas the cured portion thereof in the metal pattern W avoids etching and becomes the waveguide core 114. Then, the metal layer 104 acting as the mask is etched by an appropriate etching solution as shown in FIG. 8.

Figure 9:
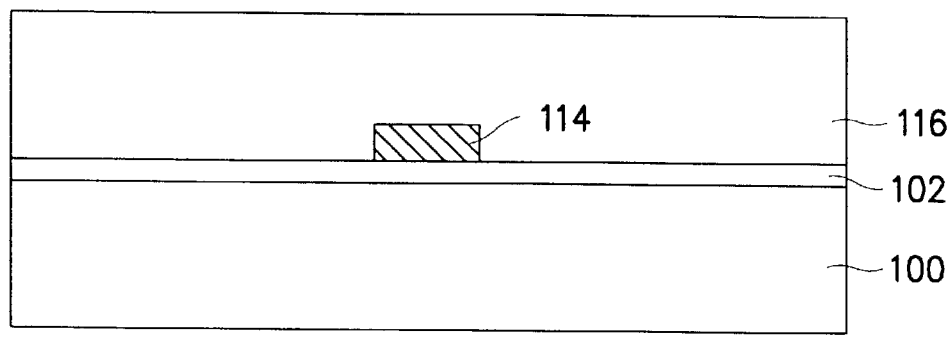
Figure 10:
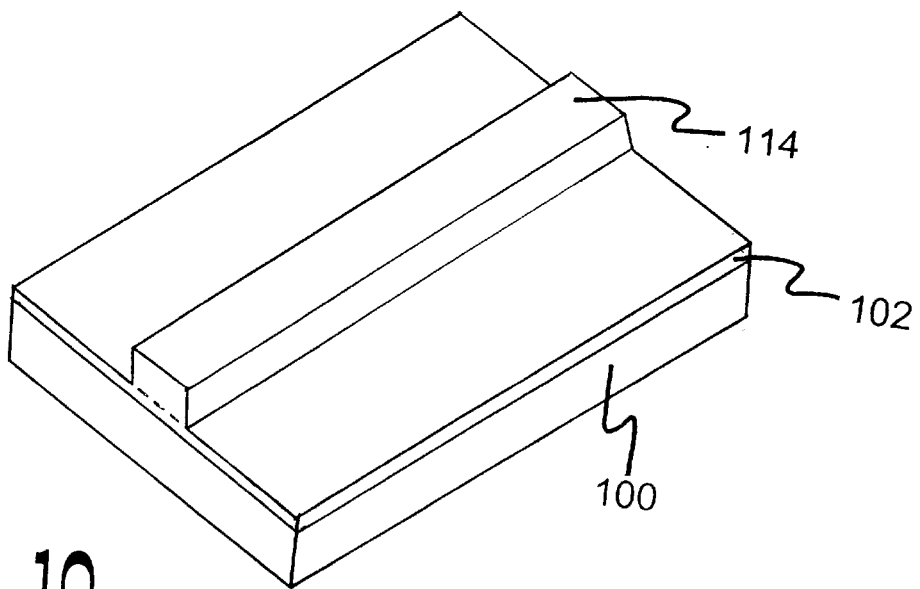
FIG. 10 is a plan view and a sectional view of an optical waveguide device fabricated according to the preferred embodiment of the present invention.

In FIG. 9, an upper clad layer 116 is formed of a clad material having a lower refractive index than the waveguide core 114, on the lower clad layer 102 having the waveguide core 114 thereon in order to complete the optical waveguide device fabrication process. FIG. 10 illustrates a plan view of an optical waveguide device fabricated according to the process of FIGS. 1–9.

In this situation, poling incurred by the electrical field of a non-linear optical polymer can be applied by providing transparent electrodes on the substrate 100, and the electrodes can be used for fabrication of an optical device relying on electrooptical effects. In addition, metal electrode heater or metal electrode may be formed on the upper clad layer 116 in order to fabricate a device using thermooptical or electrooptical effects.

Figure 11:
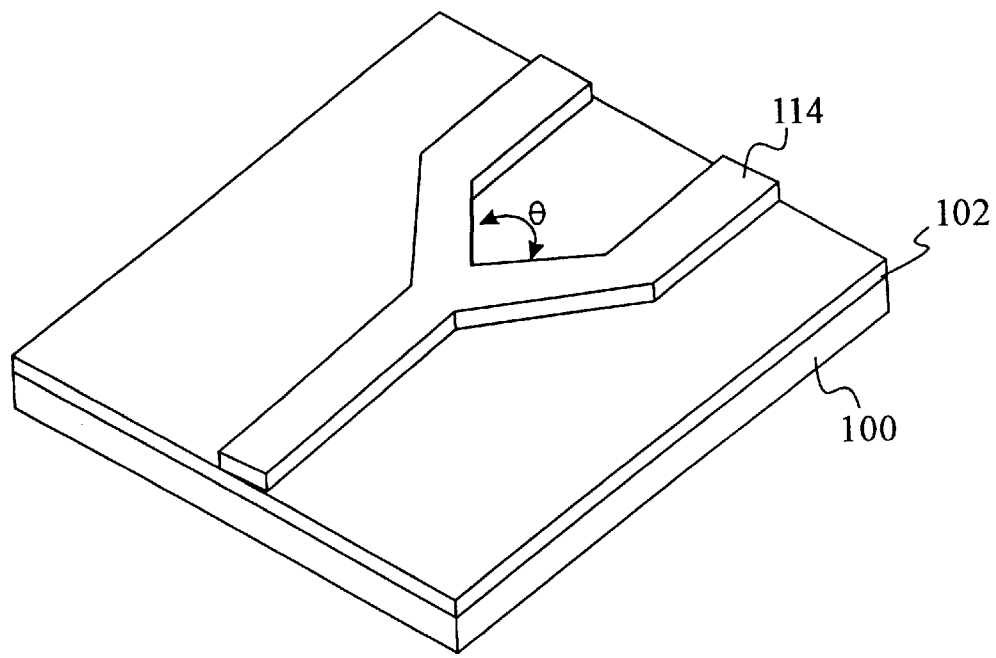
FIG. 11 is a plan view and a sectional view of another embodiment of an optical waveguide device fabricated according to the principles of the present invention.
Figure 12:
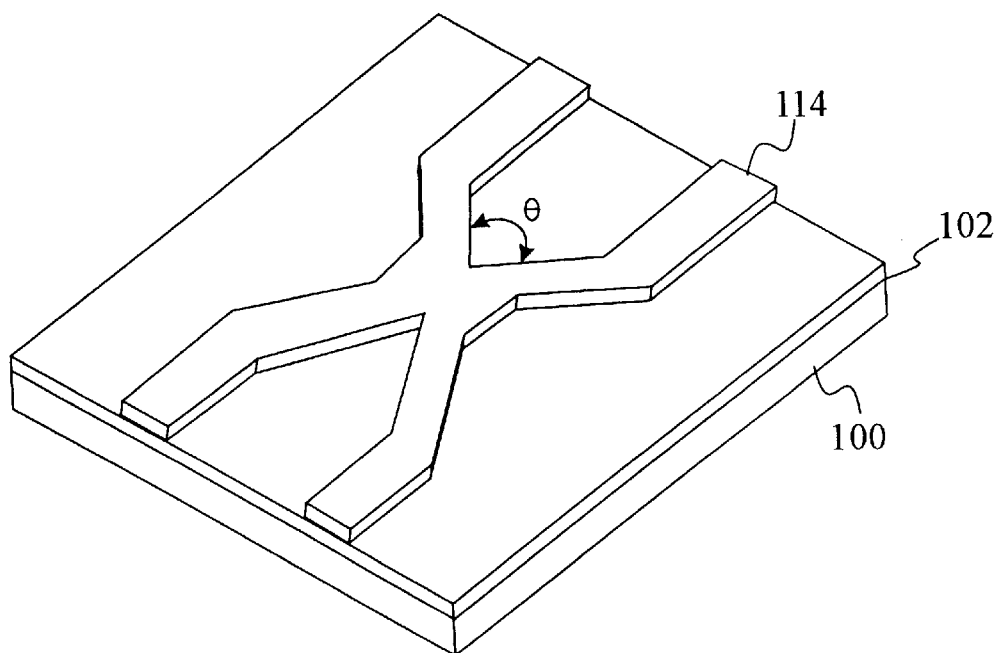
FIG. 12 is a plan view and a sectional view of yet another embodiment of an optical waveguide device fabricated according to the principles of the present invention.

The optical waveguide fabricating process of the present invention is not limited to the embodiment as described in FIGS. 1–9. The optical waveguide devices may have different configurations. For example, FIG. 11 illustrates a plan view of a Y-shaped optical waveguide fabricated according to the principles of the present invention; and FIG. 12 is a plan view of an extended X-shaped optical waveguide fabricated according to the principles of the present invention. The Y-shaped optical waveguide device is often used as a waveguide coupler. Similarly, the extended X-shaped optical waveguide device is often used as a branch connector. The waveguide core 114 is formed on the lower clad layer 102 of substrate 100 in the same manner described in FIGS. 1–9, using either a Y-shaped mask or an extended X-shaped mask for mask as shown in FIG. 3. The angle θ shown in FIG. 11 is the angle at which the incident light is split by the Y-shaped coupler.

As described above, in the optical waveguide device fabricating method according to the embodiment of the present invention, process simplicity can be achieved by using a UV-curable optical polymer for fabrication of an optical waveguide device. In addition, the optical polymer layer and a photomask can be prevented from contamination caused by a direct contact between a photomask and the optical polymer layer, through the back illumination of UV light. The metal layer is used as a mask with respect to the UV light irradiated onto the lower surface of a substrate obviates the need for aligning the photomask on the substrate, resulting in self-alignment effect.

While there have been illustrated and described what are considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation to the teaching of the present invention without departing from the central scope thereof. Therefore, it is intended that the present invention not be limited to the particular embodiment disclosed as the best mode contemplated for carrying out the present invention, but that the present invention includes all embodiments falling within the scope of the appended claims.

What is claimed is:

1. A method of fabricating an optical waveguide device, comprising the steps of:

forming a lower clad layer on the surface of a substrate;

forming a metal layer on the lower clad layer;

using a mask to selectively etch the metal layer into a metal pattern for forming a waveguide core therein;

forming an optical polymer layer on the metal pattern;

curing the optical polymer layer in a metal-free portion of the metal pattern by irradiating ultraviolet light onto the lower surface of the substrate;

forming the waveguide core by removing the uncured portion of optical polymer layer and removing the metal layer; and forming an upper clad layer on the lower clad layer and the waveguide core.

2. The method of claim 1, further comprised of said substrate being formed from one of a slide glass, polycarbonate, and polymethyl methacrylate.

3. The method of claim 1, further comprised of said optical polymer layer exhibiting optical transparency in an optical wavelength area used for guiding carrier waves of optical frequencies, and is formed of a non-linear polymer material having a higher refractive index than the upper clad layer and the lower clad layer.

4. The method of claim 1, further comprised of said optical polymer layer exhibiting optical transparency in an optical wavelength area used for guiding carrier waves of optical frequencies, and is formed of a linear polymer material having a higher refractive index than the upper clad layer and the lower clad layer.

5. The method of claim 1, said steps of removing said optical polymer layer and said metal layer comprising use of etching solutions.

6. A method of fabricating an optical waveguide device, comprising the steps of:

providing a substrate having a coefficient of thermal expansion and top and bottom surfaces;

forming on the top surface of said substrate, a lower clad layer to act as an undercladding;

depositing on said lower clad layer a metal layer;

irradiating a light beam on the metal layer via a mask to form a metal pattern corresponding to a waveguide core;

depositing a polymer layer on the metal layer in accordance with the metal pattern;

irradiating said light beam onto the bottom surface of said substrate to cure the polymer layer deposited on the polymer layer in accordance with the metal pattern for forming said waveguide core;

removing the uncured polymer layer and the metal layer; and forming an upper clad layer on the waveguide core and the lower clad layer to act as an uppercladding.

7. The method of claim 6, further comprised of said substrate being formed from one of a slide glass, polycarbonate, and polymethyl methacrylate.

8. The method of claim 6, further comprised of said polymer layer exhibiting optical transparency in an optical wavelength area used for guiding carrier waves of optical frequencies, and is formed of a non-linear polymer material having a higher refractive index than the upper clad layer and the lower clad layer.

9. The method of claim 6, further comprised of said polymer layer exhibiting optical transparency in an optical wavelength area used for guiding carrier waves of optical frequencies, and is formed of a linear polymer material having a higher refractive index than the upper clad layer and the lower clad layer.

10. The method of claim 6, said steps of removing said polymer layer and said metal layer comprising use of etching solutions.

11. A method of making an optical waveguide device, comprising the steps of:

forming a lower clad layer, made of a transparent glass, on a substrate;

depositing a metal layer on the lower clad layer;

depositing a photoresist layer on the metal layer;

irradiating the photoresist and metal layer through a mask for forming a pattern in the metal layer;

developing the photoresist and metal and removing the photoresist to leave a patterned metal layer with exposed lower clad;

depositing a layer of photocurable optical polymer, of refractive index greater than that of the lower clad, on the metal layer and exposed lower clad;

irradiating with UV light from the substrate side for curing the optical polymer to form a waveguide in the pattern masked by the metal film;

removing the uncured optical polymer;

etching the metal to remove the metal layer; and forming an upper clad layer, made of material of lower refractive index than the optical polymer, on the lower clad layer and optical polymer waveguide.

12. The method of claim 11, further comprising using a substrate made of slide glass or polymer glass made of polycarbonate or polymethyl methacrylate.

13. The method of claim 11, further comprising forming the lower clad layer of Si, $SiO_2$, $LiNbO_3$, InP, or GaAs.

14. The method of claim 11, said step of depositing a photoresist further comprising depositing the photoresist by spin-coating.

15. The method of claim 11, further comprising making the photocurable optical polymer of polydiacetylene, polymethacrylic acid, methyl polystyrene, or polycarbonate polyimide.

16. The method of claim 11, further comprising making the photocurable optical polymer of a non-linear optical polymer.

17. The method of claim 16, further comprising the step of providing transparent electrodes on the substrate for poling of the non-linear optical polymer.

18. The method of claim 11, further comprising the step of forming a metal electrode on the upper clad layer for forming an electrooptical device.

19. The method of claim 11, further comprising the step of forming a metal electrode heater on the upper clad layer for forming a thermooptical device.

20. The method of claim 11, said step of irradiating the photoresist and metal layer comprising use of a Y-shaped mask or an X-shaped mask.

* * * * *